US010637456B2

(12) United States Patent
Reusch et al.

(10) Patent No.: US 10,637,456 B2
(45) Date of Patent: Apr. 28, 2020

(54) LOW VOLTAGE DROP CASCADED SYNCHRONOUS BOOTSTRAP SUPPLY CIRCUIT

(71) Applicant: Efficient Power Conversion Corporation, El Segundo, CA (US)

(72) Inventors: David C. Reusch, Blacksburg, VA (US); Suvankar Biswas, Blacksburg, VA (US); Michael A. de Rooij, Playa Vista, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/038,401

(22) Filed: Jul. 18, 2018

(65) Prior Publication Data

US 2019/0028094 A1    Jan. 24, 2019

Related U.S. Application Data

(60) Provisional application No. 62/534,930, filed on Jul. 20, 2017.

(51) Int. Cl.
*H02M 1/088* (2006.01)
*H03K 17/06* (2006.01)
*H02M 3/00* (2006.01)
*G05F 1/46* (2006.01)

(52) U.S. Cl.
CPC .......... *H03K 17/063* (2013.01); *H02M 1/088* (2013.01); *G05F 1/46* (2013.01); *H02M 3/00* (2013.01)

(58) Field of Classification Search
CPC ...... H03K 17/063; H02M 1/088; H02M 3/00; G05F 1/46
See application file for complete search history.

(56) References Cited

U.S. PATENT DOCUMENTS

| 7,592,857 B2 * | 9/2009 | Wu ........................ H02M 3/073 327/536 |
| 8,569,842 B2 * | 10/2013 | Weis .................... H01L 27/0207 257/194 |
| 8,724,353 B1 | 5/2014 | Giuliano et al. |
| 9,667,245 B2 | 5/2017 | de Rooij et al. |

OTHER PUBLICATIONS

D. Reusch, "High Frequency, High Power Density Integrated Point of Load and Bus Converters," Ph.D. Dissertation, Virginia Tech., 2012.

* cited by examiner

*Primary Examiner* — Hai L Nguyen
(74) *Attorney, Agent, or Firm* — Blank Rome LLP

(57) ABSTRACT

A cascaded synchronous bootstrap supply circuit with reduced voltage drop between the cascaded bootstrap capacitors by replacing bootstrap diodes with gallium nitride (GaN) transistors. GaN transistors have a much lower forward voltage drop than diodes, thus providing a cascaded gate driver bootstrap supply circuit with a reduced drop in bootstrap capacitor voltage, which is particularly important as the number of levels increases.

19 Claims, 13 Drawing Sheets

US 10,637,456 B2

LOW VOLTAGE DROP CASCADED SYNCHRONOUS BOOTSTRAP SUPPLY CIRCUIT

This application claims the benefit of U.S. Provisional Application No. 62/534,930, filed on Jul. 20, 2017, the entire contents of which are hereby incorporated by reference herein.

BACKGROUND

Power supplies and power converters are used in a variety of electronic systems. Electrical power is generally transmitted over long distances as an alternating current (AC) signal. The AC signal is divided and metered as desired for each business or home location, and is often converted to direct current (DC) for use with individual electronic devices or components. Modern electronic systems often employ devices or components designed to operate using different DC voltages.

One type of power converter is referred to as a multi-level converter because more than two voltage levels are used to generate an output voltage. As a general rule, multi-level converters step-up to or step-down from a certain voltage using smaller discrete stages. There are numerous multi-level converter topologies, where different topologies vary with regard to efficiency, complexity, and ease of miniaturization (e.g., forming a multi-level converter using integrated circuits). In some examples, a multi-level converter includes a network of switches and capacitors, as well as a control mechanism for the switches. When the switches are power transistors, the control circuit can be referred to as a gate driver circuit, which can be a discrete circuit, a partially integrated circuit, or a fully integrated circuit (IC).

FIG. 1 shows a prior art cascaded bootstrap gate driver circuit for a multi-level converter. In the multilevel converter of FIG. 1, $Q_{TN}$, $Q_{T2}$, $Q_{T1}$, and $Q_L$ are power transistors; $D_{BN}$, $D_{B2}$, $D_{B1}$ are bootstrap diodes; $R_{DBN}$, $R_{DB2}$, $R_{DB1}$ are bootstrap resistors; $C_{BN}$, $C_{B2}$, $C_{B1}$ are bootstrap capacitors; and VDR is the gate driver power supply voltage (e.g., 5 V in FIG. 1); CD is a decoupling capacitor(s); $D_1$-$D_N$ are non-ground referenced gate drivers; $D_L$ is a ground referenced gate driver that does not require level shift or bootstrapping; and $V_{BUS}$ is the power supply voltage source.

The operation of the cascaded gate driver circuit of FIG. 1 includes various charging periods represented by dashed loops 102, 104, and 106. In charging period 1, $Q_L$ is on and $C_{B1}$ is charged by $V_{DR}$ to $V_{CB1} \approx V_{DR} - V_{DB1} - V_{RDB1} \approx 4.5$ V (assuming $V_{RDBX} \approx 0$ V and $V_{DBX} \approx 0.5$ V). In charging period 2, $Q_{T1}$ is on and $C_{B2}$ is charged by $C_{B1}$ to $V_{CB2} \approx V_{CB1} - V_{DB2} - V_{RDB2} \approx 4.0$ V. In charging period N, $Q_{TN-1}$ is on and $C_{BN}$ is charged by $C_{BN-1}$ to $V_{CBN} \approx V_{CBN-1} - V_{DBN} - V_{RDBN} \approx V_{DR} - N(V_{RDBN} + V_{DBN})$. If N=3, $V_{CB3} \approx 3.5$ V. If N=4, $V_{CB} \approx 3.0$ V. For the gate driver circuit of FIG. 1, a diode drop occurs during each charging period. Thus, as the number of levels increases, the subsequent bootstrap capacitor voltage in the charging sequence decreases. This drop in voltage in each subsequent stage limits the number of levels that can be supported. Accordingly, a need exists for a cascaded bootstrap supply circuit with a reduced voltage drop between the cascaded bootstrap capacitors.

SUMMARY OF THE INVENTION

The present invention overcomes the above-noted deficiencies of the prior art by providing a cascaded synchronous bootstrap supply circuit with reduced voltage drop between the cascaded bootstrap capacitors by replacing the bootstrap diodes of prior art circuits with gallium nitride (GaN) transistors. GaN transistors have a much lower forward voltage drop than diodes, can be made to support higher voltages, and have no reverse recovery, thus providing a cascaded gate driver bootstrap supply circuit with a reduced drop in bootstrap capacitor voltage, which is particularly important as the number of levels increases.

BRIEF DESCRIPTION OF THE DRAWINGS

For a detailed description of various examples, reference will now be made to the accompanying drawings in which.

DETAILED DESCRIPTION OF THE PREFERRED EMBODIMENTS

Figure 1:
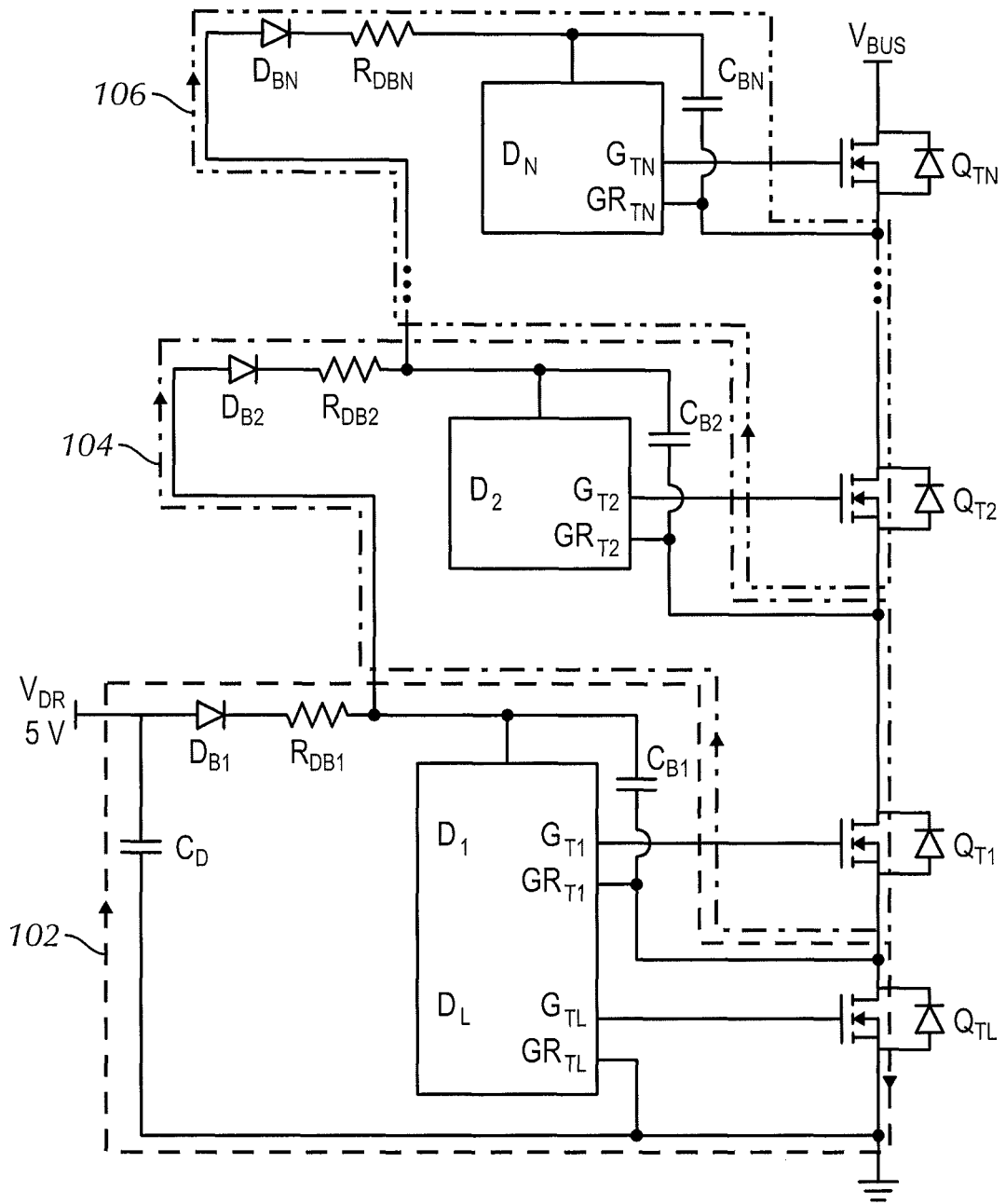
FIG. 1 shows an existing prior art cascaded bootstrap supply gate driver circuit.

The present invention is directed to low voltage drop synchronous cascaded bootstrap supply circuits for multi-level DC-DC power converters. The circuit of the present invention comprises a plurality of cascaded gate driver control loops, each loop having a gallium nitride (GaN) transistor, a bootstrap capacitor, and a driver stage configured to selectively couple and decouple an adjacent control loop. In operation, each drive control loop is configured to selectively drive a separate power transistor (e.g., in a multi-level converter or switched-capacitor converter). More specifically, each drive control loop is configured to drive a separate power transistor in a sequence. In at least some embodiments, each drive stage comprises a controller, level shift logic, and complementary switches to follow the desired sequence.

In some embodiments, the GaN transistors used in the drive control loops are enhancement mode transistors. As used herein, "enhancement mode" transistors refer to transistors that are normally "off", where a positive voltage applied to the transistor gate is used to turn the transistor "on". In other embodiments, the GaN transistors used for the drive control loops are depletion mode transistors. As used herein, "depletion mode" transistors refer to transistors that are normally "on", where a negative voltage applied to the transistor gate is used to turn the transistor "off".

Further, most of the drive control loops are non-ground referenced loops while one drive control loop is a ground referenced loop. Specifically, the cascaded bootstrap supply circuit of the present invention comprises a base drive control loop that is a ground referenced loop, where the base drive control loop comprises a bootstrap capacitor, a diode, a resistor, and a drive stage configured to selectively couple and decouple an adjacent drive control loop.

In different embodiments, various components are included or omitted for one or more of the drive control loops. More specifically, in some embodiments, each bootstrap capacitor is coupled to a current terminal of a respective GaN transistor via a resistor. Also, in some embodiments (e.g., where the GaN transistors are enhancement mode transistors), a bootstrap diode and an auxiliary bootstrap capacitor (e.g., bootstrap FET drive capacitor) are included in each drive control loop and are coupled to a gate terminal of a respective GaN transistor. In other embodiments (e.g., where the GaN transistors are depletion mode transistors), the bootstrap diode and auxiliary bootstrap capacitor for each drive control loop is omitted. In some embodiments (e.g., in designs requiring more accurate control of the bootstrap capacitor voltages), one or more of the drive control loops includes a voltage regulator. The voltage regulator comprises a linear dropout (LDO) regulator or a switched-mode power supply. In some embodiments (e.g., in designs requiring protection and/or more accurate control of the bootstrap capacitor voltages), each drive control loop includes a Zener diode in parallel with a respective bootstrap capacitor.

In different embodiments, the circuit of the present invention comprises discrete components (e.g., components mounted on a printed circuit board (PCB)). Additionally or alternatively, is some embodiments, the circuit comprises integrated circuit components. In one example, the entire circuit is a single integrated circuit. In another example, the circuit is formed of multiple integrated circuits that are coupled together. To provide a better understanding, various circuit details, options, and scenarios are described with reference to the figures as follows.

Figure 2:
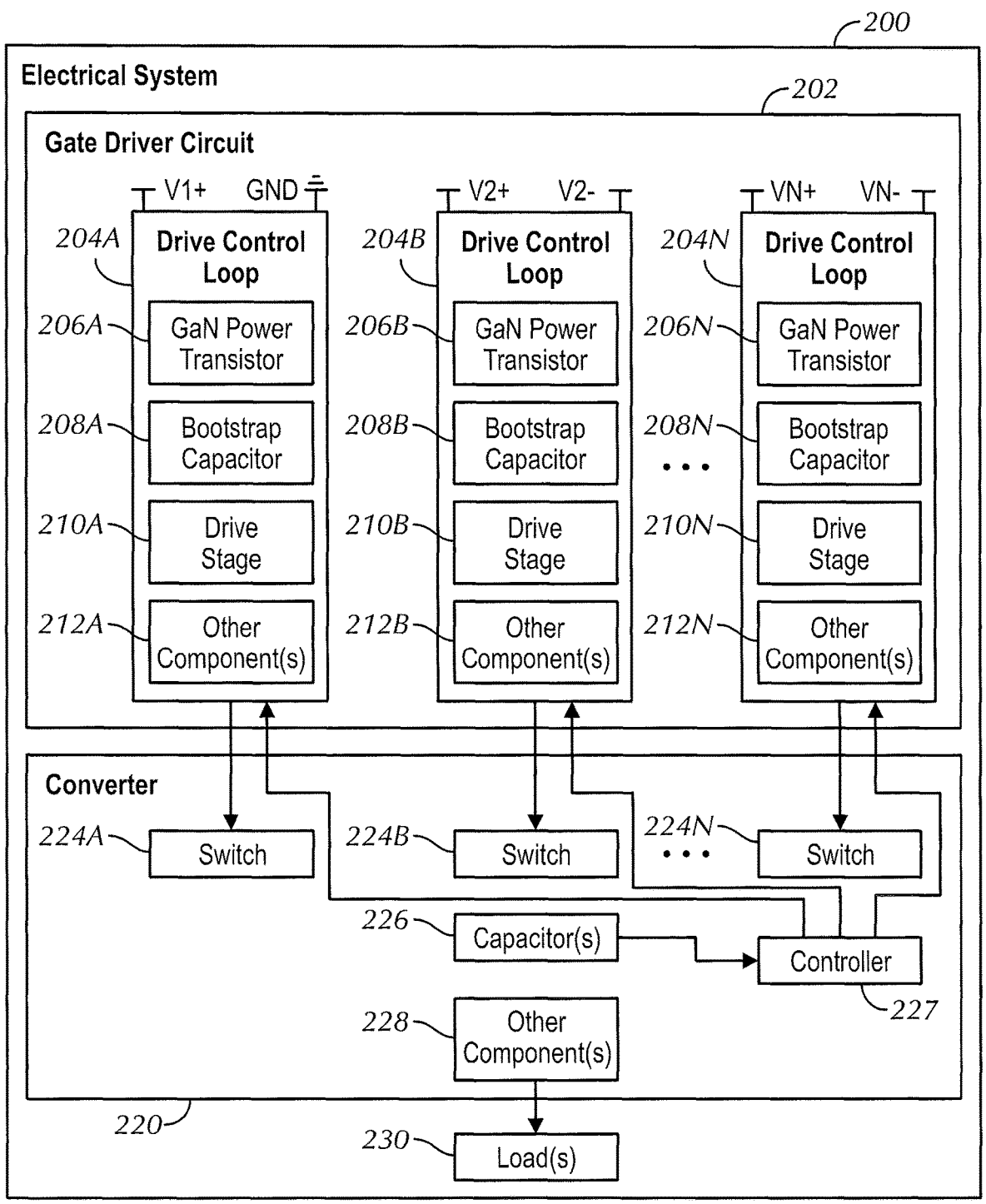
FIG. 2 shows a block diagram of an electrical system in accordance with various embodiments of the present invention.

FIG. 2 shows a block diagram of an electrical system 200 in accordance with the present invention. As shown, the electrical system 200 comprises a low voltage drop synchronous cascaded bootstrap gate driver circuit 202 having a plurality of drive control loops 204A-204N with respective GaN power transistors 206A-206N, bootstrap capacitors 208A-208N, and drive stages 210A-210N. For each of the drive control loops 204A-204N, there is a voltage differential. More specifically, the voltage differential for the drive control loop 204A is provided by voltage levels V1+ and GND, the voltage differential for the drive control loop 204B is provided by voltage levels V2+ and V2−, and so on. The drive control loop 204A is a ground referenced loop, and the other drive control loops 204B-204N are non-ground referenced loops (i.e., V2− to VN− are not the same as GND). In different embodiments, each of the drive control loops 204A-204N also comprises other component(s) 212A, such as a resistor, a bootstrap diode, an auxiliary bootstrap capacitor, a voltage regulator, and/or a Zener diode. In some embodiments, different one of the drive control loops 204A-204N vary with regard to at least some of their respective components.

The electrical system 200 also comprises a voltage converter 220 coupled to the gate driver circuit 202. The converter 220 may be a multi-level converter or more specifically, a switched-capacitor converter. More specifically, the converter 220 includes a plurality of switches 224A-224N (e.g., power transistors) coupled to a respective drive control loop 204A-204N of the gate driver circuit 202.

The converter 220 includes capacitor(s) 226 that is charged or discharged based on the operation of the switches 224A-224N. In some embodiments, the number of capacitors 226 varies relative to the number of switches 224A-224N. For example, in some embodiments, different sets of the switches 224A-224N provide charge to a given capacitor. Also, in some embodiments, the converter 220 includes other component(s) 228. The output of the converter 220 is provided to one or more loads 230.

In some embodiments, the voltages of the flying capacitors in the multi-level converter 220 need to be balanced, i.e. maintained within a specified voltage range related to a specific ratio of the main supply voltage. To provide this balance, a controller 227 may be included in the converter 220. With the controller 227, voltage balancing for the flying capacitors (e.g., the capacitor(s) 226 correspond to flying capacitors in some embodiments) is possible. In FIG. 2, the controller 227 is represented as being part of the multi-level converter 200. In other embodiments, the controller 227 is part of the gate driver circuit 202.

Figure 3:
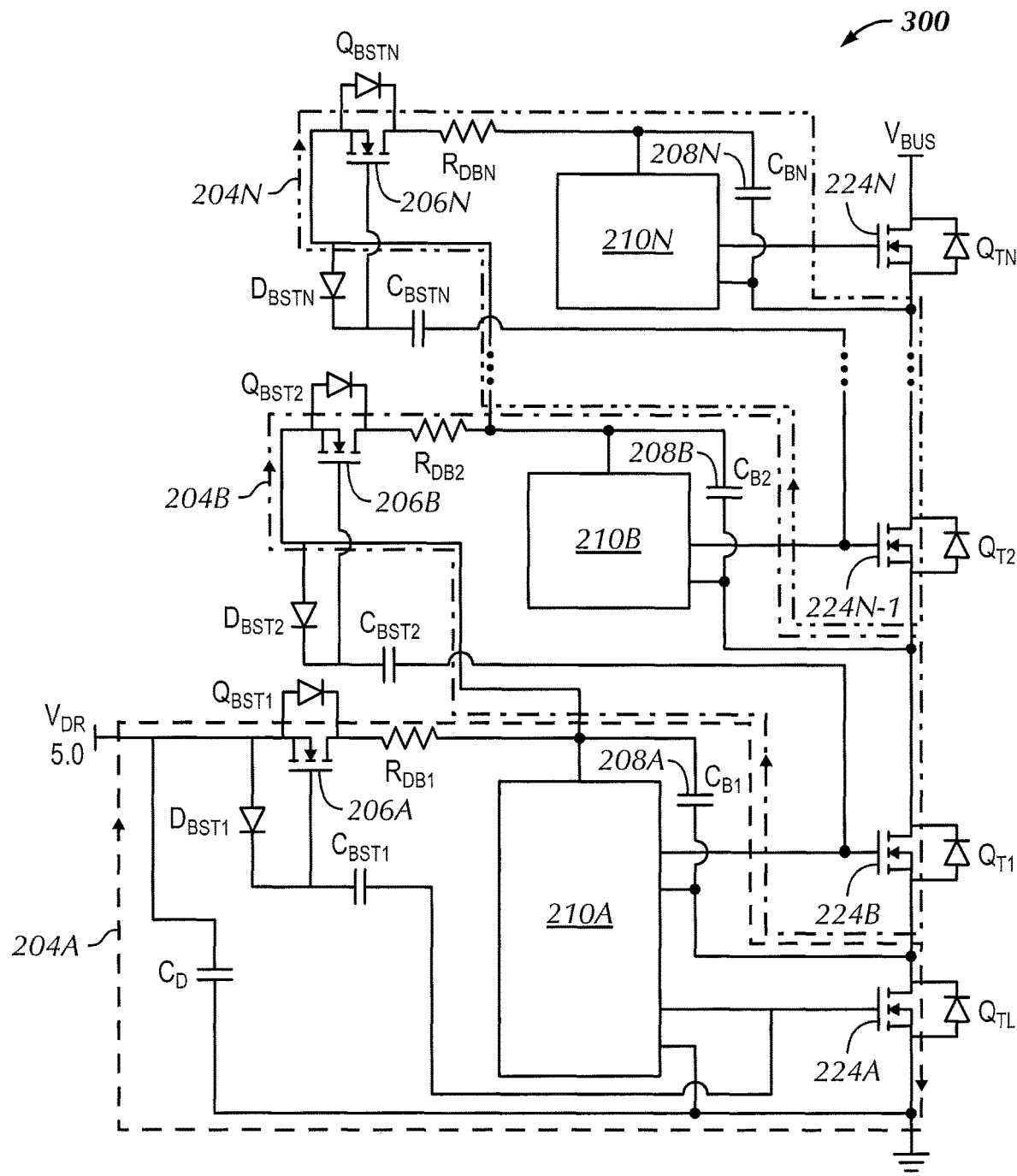
FIG. 3 shows the cascaded bootstrap supply circuit of the present invention.

FIG. 3 shows a synchronous cascaded bootstrap gate driver circuit 300 in accordance with the present invention. Circuit 300 is an example of the gate driver circuit 202 in FIG. 2. As shown, circuit 300 includes a representation of the drive control loops 204A-204N of FIG. 2 with respective GaN power transistors 206A-206N (e.g., FETs labeled $Q_{BST1}$-$Q_{BSTN}$), bootstrap capacitors 208A-208N (labeled $C_{B1}$-$C_{BN}$), and drive stages 210A-210N. Each of the drive control loops 204A-204N is configured to selectively provide a gate drive signal to a respective switch 224A-224N (e.g., power transistors labeled $Q_{TL}$ and $Q_{T1}$-$Q_{TN}$ in FIG. 3) using the drive stages 210A-210N.

Figure 4:
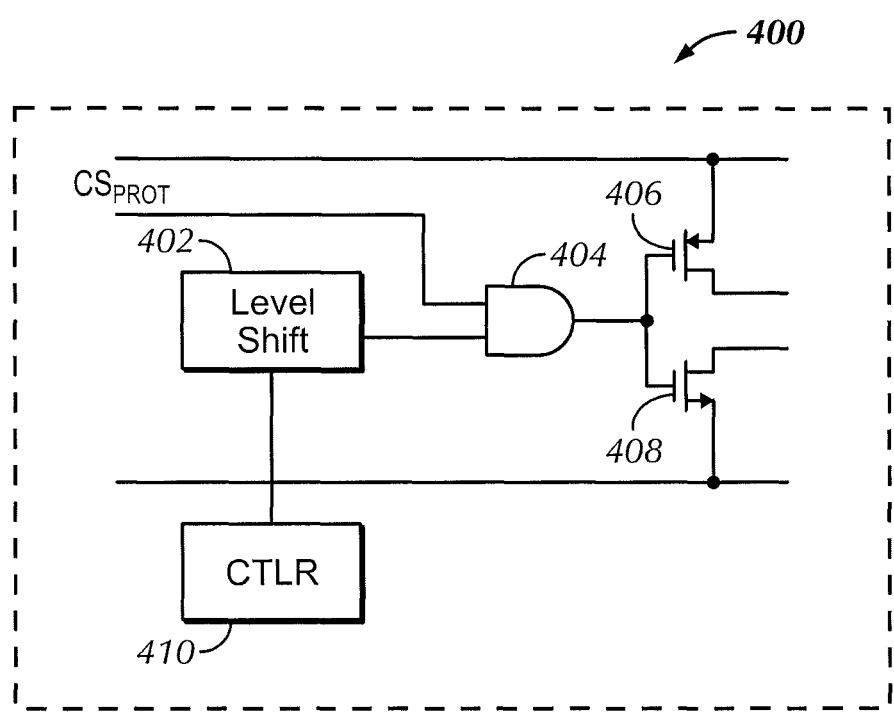
FIG. 4 shows the drive stage for the bootstrap supply circuit of FIG. 3.

FIG. 4 shows an example of a drive stage 400. The drive stage 400 of FIG. 4 corresponds to each of the drive stages 210B-210N. As shown, the drive stage 400 comprises a level shift 402, an AND gate 404, complementary switches 406 and 408, and a controller 410. The controller 410 is a pulse width modulator and/or other logic to provide a drive signal to the level shift 402. The output of the level shift 402 is input to the AND gate 404 along with a control signal ($CS_{PROT}$) that provides protection as needed. For example, if there is a system error, $CS_{PROT}$ will be low and the drive stage 400 will not provide a signal to the complementary switches 406 and 408. Otherwise, $CS_{PROT}$ will be high, allowing gate drive operations. The drive stage 210A of FIG. 3 includes two sets of the components represented for the drive stage 400 of FIG. 4, where one of the sets omits the level shift. Drive stages, such as the drive stage 400, can be implemented in numerous variations and thus the drive stage 400 should not be interpreted as limiting embodiments to a particular drive stage topology.

Returning to FIG. 3, circuit 300 also includes other components (e.g., corresponding to the other components 212A-212N in FIG. 2), such as bootstrap resistors (labeled $R_{DB1}$-$R_{DBN}$), bootstrap diodes (labeled $D_{BST1}$-$D_{BSTN}$), bootstrap FET drive capacitors (labeled $C_{BST1}$-$C_{BSTN}$, and sometimes referred to as auxiliary bootstrap capacitors herein), and a decoupling capacitor (labeled Co). In FIG. 3, the voltage differential for the drive control loop 204A is provided by a gate driver power supply, $V_{DR}$ (an example of V1+ in FIG. 2), and GND. Another power supply, $V_{BUS}$, is a power supply for converter circuit 220 and is shown as being input to a current terminal of $Q_{TN}$.

Relative to the prior art circuit of FIG. 1, the circuit 300 of FIG. 3 uses active GaN transistors ($Q_{BST1}$-$Q_{BSTN}$) instead of bootstrap diodes ($D_{B1}$-$D_{BN}$). In FIG. 3, the GaN transistors are enhancement mode transistors, and each GaN transistor forms a network with a respective diode (one of $D_{BST1}$-$D_{BSTN}$) and bootstrap FET drive capacitor (one of $C_{BST1}$-$C_{BSTN}$). In operation, the drive control loops 204A-204N are configured to drive respective switches 224A-224N in a sequence. In charging period #1, when $Q_L$ is on, $C_{B1}$ is charged by $V_{DR}$ to a value $V_{CB1}$, with this being the drive stage with a ground reference, 204A. For example, if $V_{RDBX} \approx 0$ V and $V_{BSTX} \approx 0.2$ V, then $V_{CB1} \approx V_{DR}$-$V_{BST1}$-$V_{RDB1} \approx 4.8$ V. In charging Period #2 (represented by drive control loop 204B), when $Q_{T1}$ is on, $C_{B2}$ is charged by $C_{B1}$ to $V_{CB2}$ without a ground reference. For the example values given for charging period #1, $V_{CB2} \approx V_{CB1}$-$V_{BST2}$-$V_{RDB2} \approx 4.6$ V. For cascaded charging Period # N, when $Q_{TN-1}$ is on, $C_{BN}$ is charged by $C_{BN-1}$ to $V_{CBN}$, where $V_{CBN} \approx V_{CBN-1}$-$V_{BSTN}$-$V_{RDBN} \approx V_{DR}$-N($V_{RDBN}$+$V_{DBN}$). For the example values given herein, if N=3, $V_{CB3} \approx 4.4$ V. If N=4, $V_{CB4} \approx 4.2$ V, and so on. For the charging sequence, charging begins at the lowest level ($C_{B1}$ is charged first) and moves upward.

More specifically, each of drive control loops 204B-204N has an "off" state and an "on" state. For example, for the drive control loop 204B, when $Q_{TN-1}$ ($Q_{T1}$ in FIG. 3) is in the off state, $C_{BN-1}$ ($C_{B1}$ in FIG. 3) will forward bias $D_{BSTN}$ ($D_{BST2}$ in FIG. 3) and charge $C_{BSTN}$ ($C_{BST2}$ in FIG. 3) to $VC_{BN-1}$-$VD_{BSTN}$. When $Q_{TN-1}$ ($Q_{T1}$ in FIG. 3) is in the on state, $Q_{BSTN}$ ($Q_{BST2}$ in FIG. 3) is driven on by $C_{BSTN}$ ($C_{BST2}$ in FIG. 3) and $C_{BN}$ ($C_{B2}$ in FIG. 3) will be charged by the lower level bootstrap capacitor $C_{BN-1}$ ($C_{B1}$ in FIG. 3). Because of the lower voltage drop on an active GaN power transistor ($Q_{BST}$), the voltage difference between $VC_{BN}$ and $VC_{BN-1}$ will be significantly reduced compared to prior art techniques. This sequence repeats to drive N levels of stacked GaN power transistors.

Relative to the prior art circuit of FIG. 1, actively controlled low voltage drop cascaded bootstrap devices ($Q_{BST1}$-$Q_{BSTN}$) significantly reduce voltage drop in cascaded bootstrap circuitry. This enables a higher number (N) of levels than the prior art circuit of FIG. 1 without complicated circuitry to account for large voltage drops. Also, the cascaded circuitry provides a minimalistic electrical loop and inductance path for charging the bootstrap capacitor at a desired level (e.g., by using the single power transistor immediately below a given loop). In other words, each bootstrap capacitor (e.g., $C_{BX}$, where x is 1 to N-1) charges through a power transistor below a given loop (e.g., $Q_{T(X-1)}$, where x is 1 to N-1). This ensures that none but the lowest bootstrap capacitor ($C_{B1}$) charges using GND, resulting in a consistent electrical charging path. The cascaded circuits described herein can be used for any stacked or hybrid stacked topology, since each bootstrap capacitor (e.g., $C_{B1}$-$C_{BN}$) only needs the power transistor (e.g., $Q_{TL}$, $Q_{T1}$-$Q_{TN-1}$) immediately below it (in the previous loop) to turn on in order to charge itself.

Figure 5:
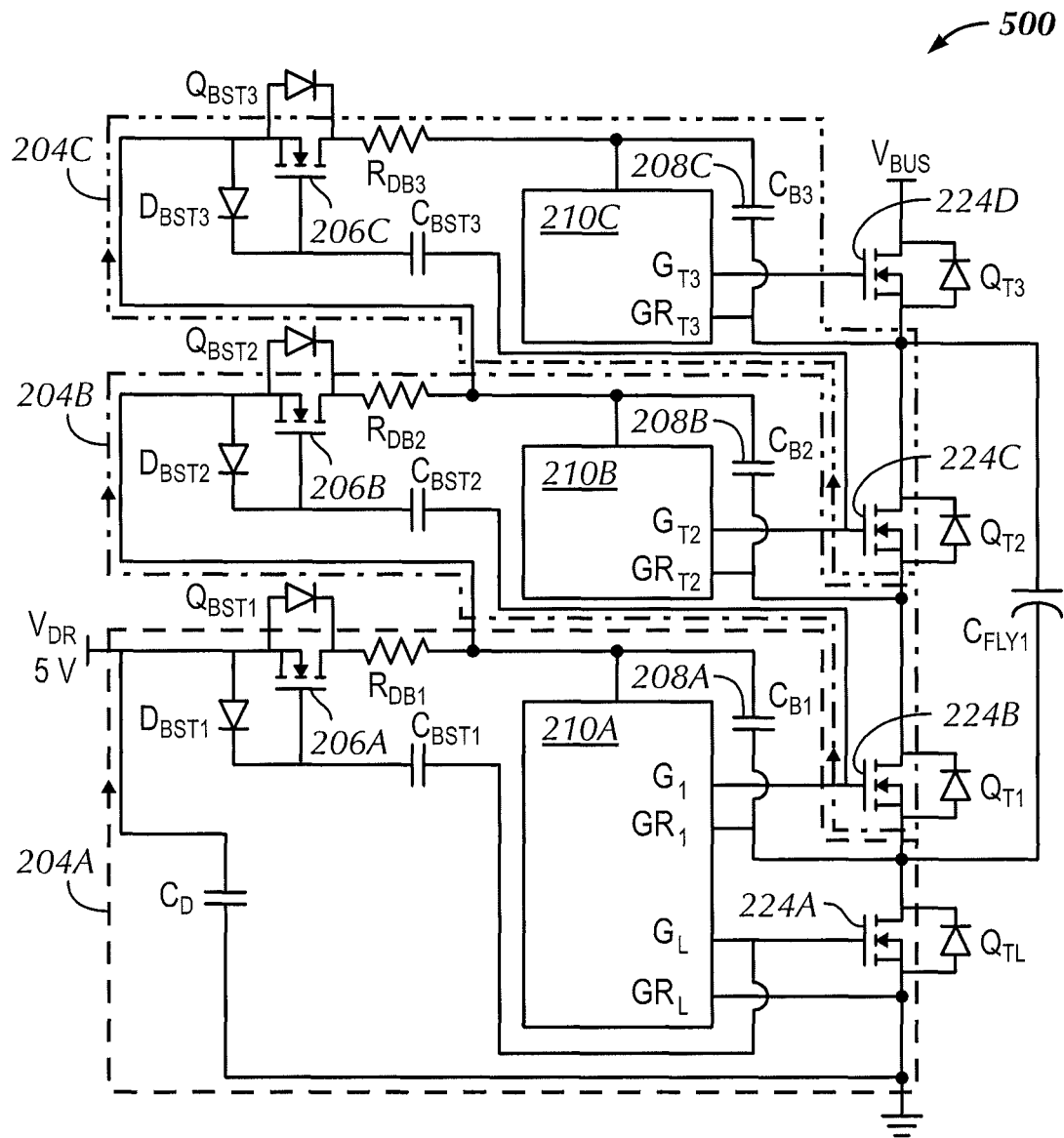
FIG. 5 shows a schematic diagram of a three-level flying capacitor circuit in accordance with the present invention.

FIG. 5 shows a schematic diagram of a three-level flying capacitor circuit 500 (the circuit 500 is an example of the circuit 300 of FIG. 3, where N=3) in accordance with the present invention. In FIG. 5, many of the same components described for the circuit 300 in FIG. 3 are represented along with a flying capacitor (labeled $C_{FLY1}$) that is charged based on the operation of the drive control circuit components in FIG. 5. In some embodiments, a controller (see e.g., controller 227 in FIG. 2) is included with the circuit 500 to balance the voltage of the flying capacitor (labeled $C_{FLY1}$ in FIG. 5, and which is an example of the capacitor(s) 226 in FIG. 2) in the circuit 500.

Figure 6:
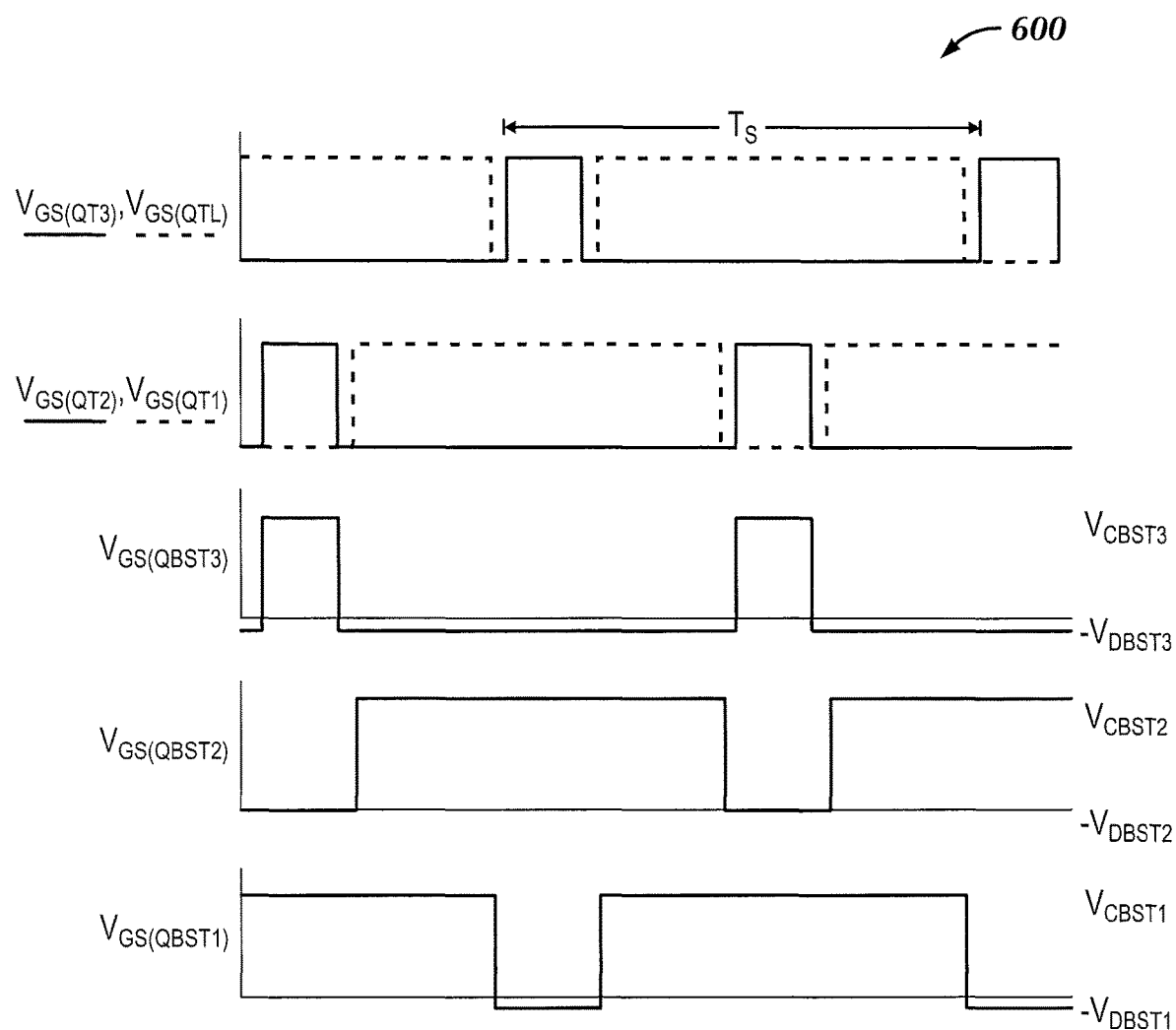
FIG. 6 shows a timing diagram for the three-level flying capacitor circuit of FIG. 5 in accordance with the present invention.

FIG. 6 shows a timing diagram 600 for the three-level flying capacitor circuit 500 of FIG. 5 in accordance with various embodiments. More specifically, the timing diagram 600 shows the gate-to-source voltage ($V_{GS}$) for different transistors as a function of time. As shown, the $V_{GS}$ for $Q_{BST1}$ includes an interval in "high" state and a second interval in a "low" state, repeating every period $T_s$. Meanwhile, the $V_{GS}$ for $Q_{BST2}$ includes an interval in low state and a second interval in a high state, repeating every period $T_s$. In the timing diagram 600, the $V_{GS}$ waveforms for $Q_{BST1}$ and $Q_{BST2}$ are shifted versions of each other, where the low states do not overlap. Meanwhile, the $V_{GS}$ for $Q_{BST3}$ includes an interval in high state and a second interval in a low state repeating every period $T_s$. As shown, the high states for the $V_{GS}$ of $Q_{BST3}$ occur during low states for the $V_{GS}$ of $Q_{BST2}$, with some offset between transitions for the $V_{GS}$ of $Q_{BST3}$ and the $V_{GS}$ of $Q_{BST2}$ (i.e., the $V_{GS}$ of $Q_{BST3}$ is nearly an inverted version of the $V_{GS}$ of $Q_{BST2}$ with some offset between their respective transitions). Meanwhile, the $V_{GS}$ for $Q_{T1}$ matches the $V_{GS}$ for $Q_{BST2}$, the $V_{GS}$ for $Q_{T2}$ matches the $V_{GS}$ for $Q_{BST3}$, and the $V_{GS}$ for $Q_{TL}$ matches the $V_{GS}$ for $Q_{BST1}$. As shown, the high states for the $V_{GS}$ of $Q_{T3}$ occur during low states for the $V_{GS}$ of $Q_{TL}$ and $Q_{BST1}$ with some offset between transitions for the $V_{GS}$ of $Q_{T3}$ and transitions for the $V_{GS}$ of $Q_{TL}$ or $Q_{BST1}$ (i.e., the $V_{GS}$ of $Q_{T3}$ is nearly an inverted version of the $V_{GS}$ of $Q_{BST1}$ or $Q_{BST1}$ with some offset between their respective transitions).

Figure 7A:
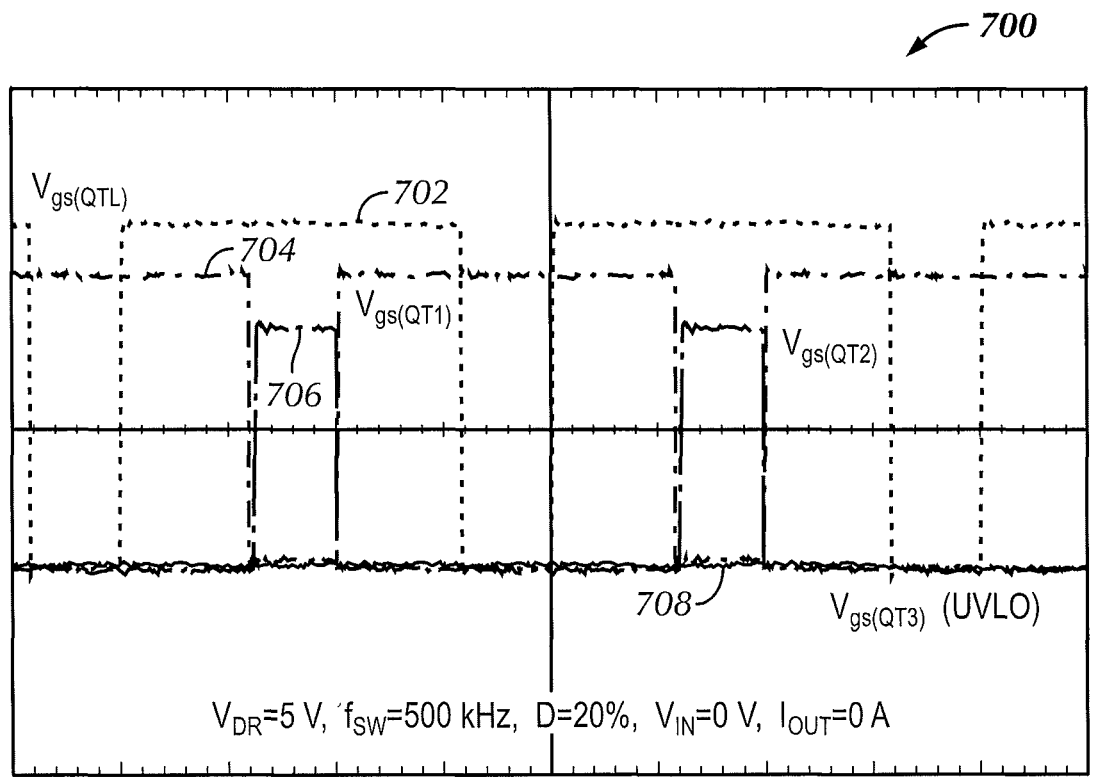
FIGS. 7A and 7B show graphs comparing voltage levels for a prior art gate driver circuit as compared to the gate driver circuit of the present invention.
Figure 7B:
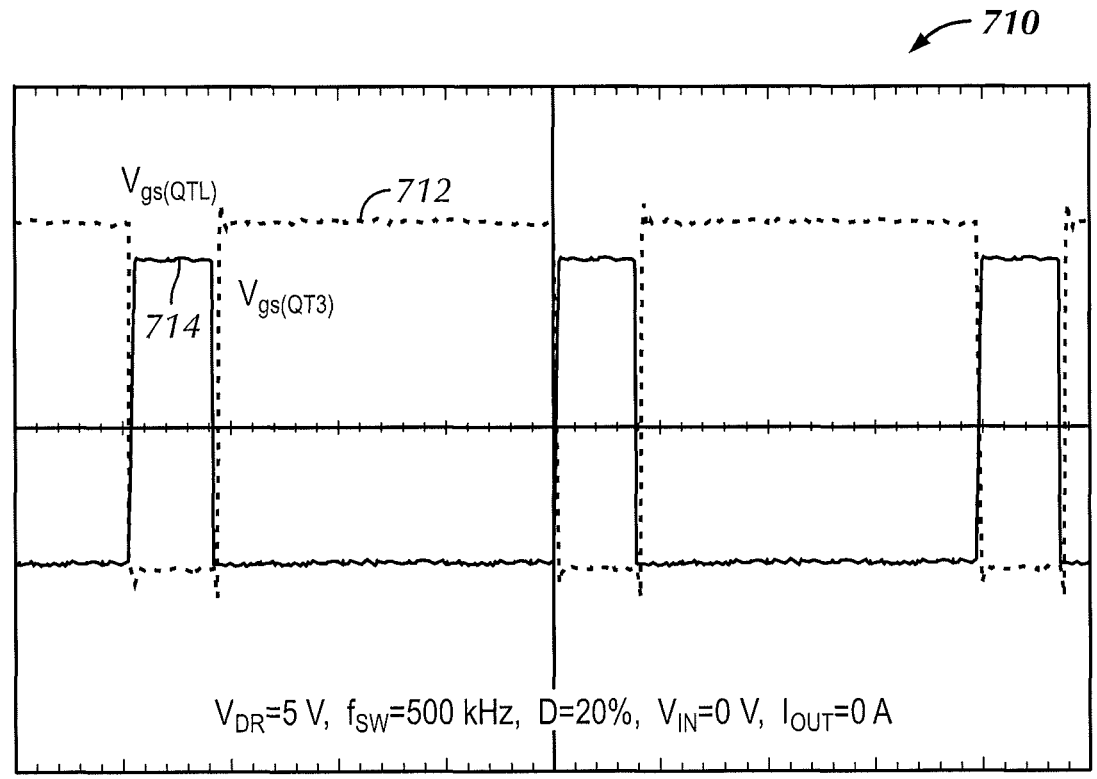

FIGS. 7A and 7B show graphs 700 and 710 comparing voltage levels for a prior art cascaded bootstrap supply circuit versus the cascaded bootstrap supply circuit of the present invention. For the graph 700 of FIG. 7A, various values are assumed for $V_{DR}$, a switching frequency ($f_{sw}$), a duty cycle (D), $V_{IN}$, and $I_{OUT}$. More specifically, $V_{DR}$=5 V, $f_{sw}$=500 kHz, D=20%, $V_{IN}$=0 V, and $I_{OUT}$=0 A. As shown, graph 700 includes a waveform 702 for $V_{gs(QTL)}$ (e.g., the gate-to-source voltage for $Q_{TL}$ in FIG. 1) that transitions between 0 and approximately 5.0 V, a waveform 704 for $V_{gs(QT1)}$ (e.g., the gate-to-source voltage for $Q_{T1}$ in FIG. 1) that transitions between 0 and approximately 4.3 V, and a waveform 706 for $V_{gs(QT2)}$ (e.g., the gate-to-source voltage for $Q_{T2}$ in FIG. 1) that transitions between 0 and approximately 3.51 V. Waveform 708 for $V_{gs(QT3)}$ (e.g., the gate-to-source voltage for $Q_{T3}$ in FIG. 1) remains at 0 V, this is due to an unsuitably low capacitor voltage on $C_{B3}$, measured to be approximately 2.8 V, triggering the drive stage, 400, protection logic, 404, keeping the gate low in an under-voltage lockout (UVLO) protection mode.

For graph 710 of FIG. 7B, the same assumed values noted for graph 700 are used. Again, $V_{DR}$=5 V, $f_{sw}$=500 kHz, D=20%, $V_{IN}$=0 V, and $I_{OUT}$=0 A. As shown in graph 710, a waveform 712 for $V_{gs(QTL)}$ (the gate-to-source voltage for $Q_{TL}$ in FIG. 5) is represented, where the waveform 712 transitions between 0 and 5.03 V. Meanwhile, a waveform 714 for $V_{gs(QT3)}$ (the gate-to-source voltage for a power transistor $Q_{T3}$ in FIG. 5) is represented, where the waveform 714 transitions between 0 and 4.48 V, allowing safe operation, with an approximately 1.7 V higher capacitor voltage on $C_{B3}$ than in the prior art discussed above. As shown in graphs 700 and 710, the cascaded bootstrap supply circuit of the present invention (e.g., circuit 300 of FIG. 3.) can support more stages with a lower voltage drop compared to the prior art circuit of FIG. 1.

Figure 8:
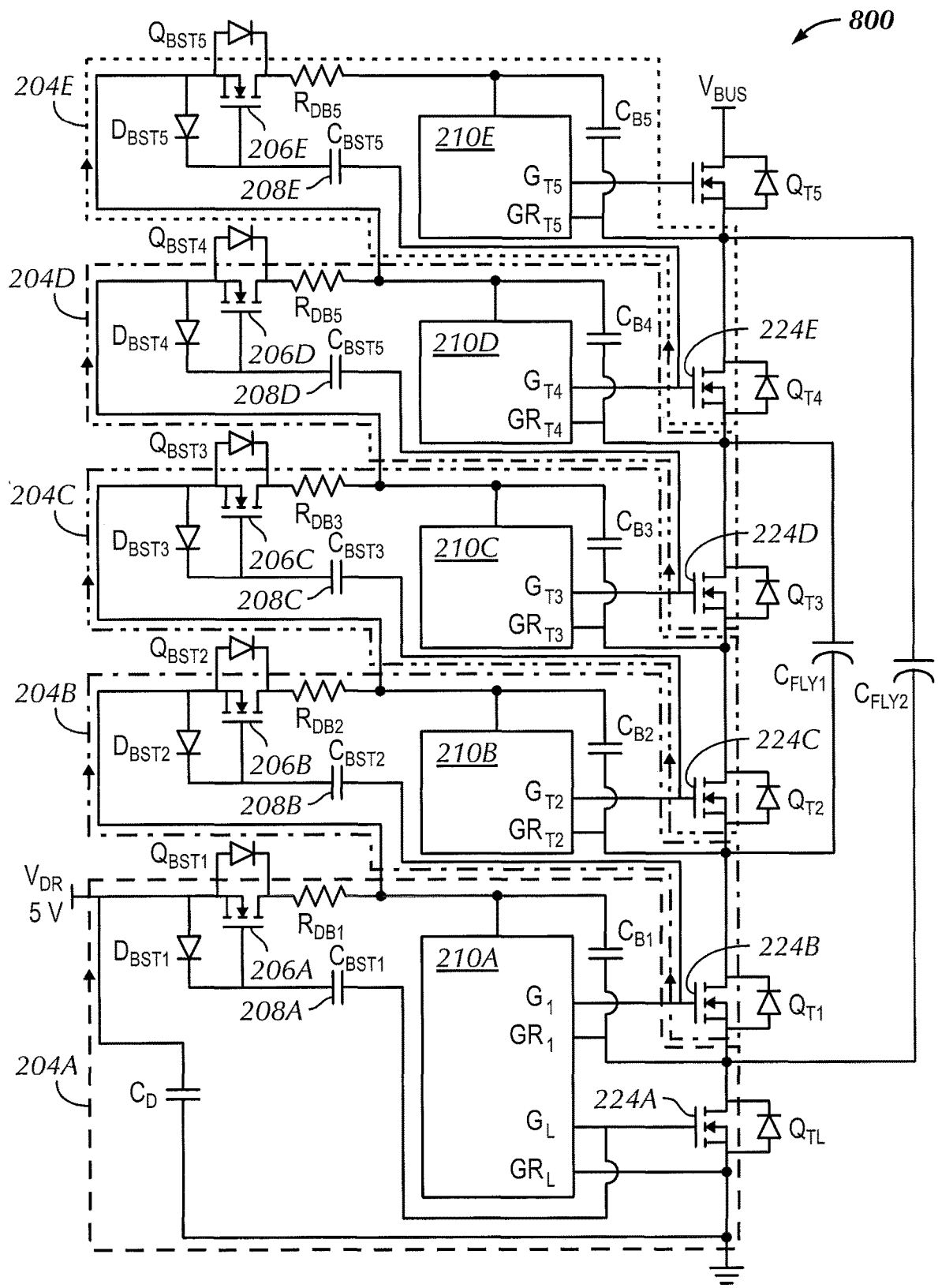
FIG. 8 shows a schematic diagram of a four-level flying capacitor circuit in accordance with the present inventions.

FIG. 8 shows a schematic diagram of a four-level flying capacitor circuit 800 (the circuit 800 is an example of the circuit 300 of FIG. 3, where N=5) in accordance with the present invention. In FIG. 8, many of the same components described for the circuit 300 in FIG. 8 are represented along with two flying capacitors (labeled $C_{FLY1}$ and $C_{FLY1}$) that are charged based on the operation of the circuit components in FIG. 8. It should be noted that one of benefits of cascaded operations using GaN transistors as described herein (see e.g., FIGS. 3, 5, and 8) is that higher frequency converters are supported compared to using linear dropout regulators (LDOs) to provide higher voltages.

In some embodiments, a controller (see e.g., the controller 227 in FIG. 2) is included with the circuit 800 to balance the voltage of the capacitors in the circuit 800. As an example, such a controller may balance the voltage of the flying capacitors (labeled $C_{FLY1}$ and $C_{FLY2}$ in FIG. 8, and which are an example of the capacitor(s) 226 in FIG. 2) in the circuit 800.

Figure 9:
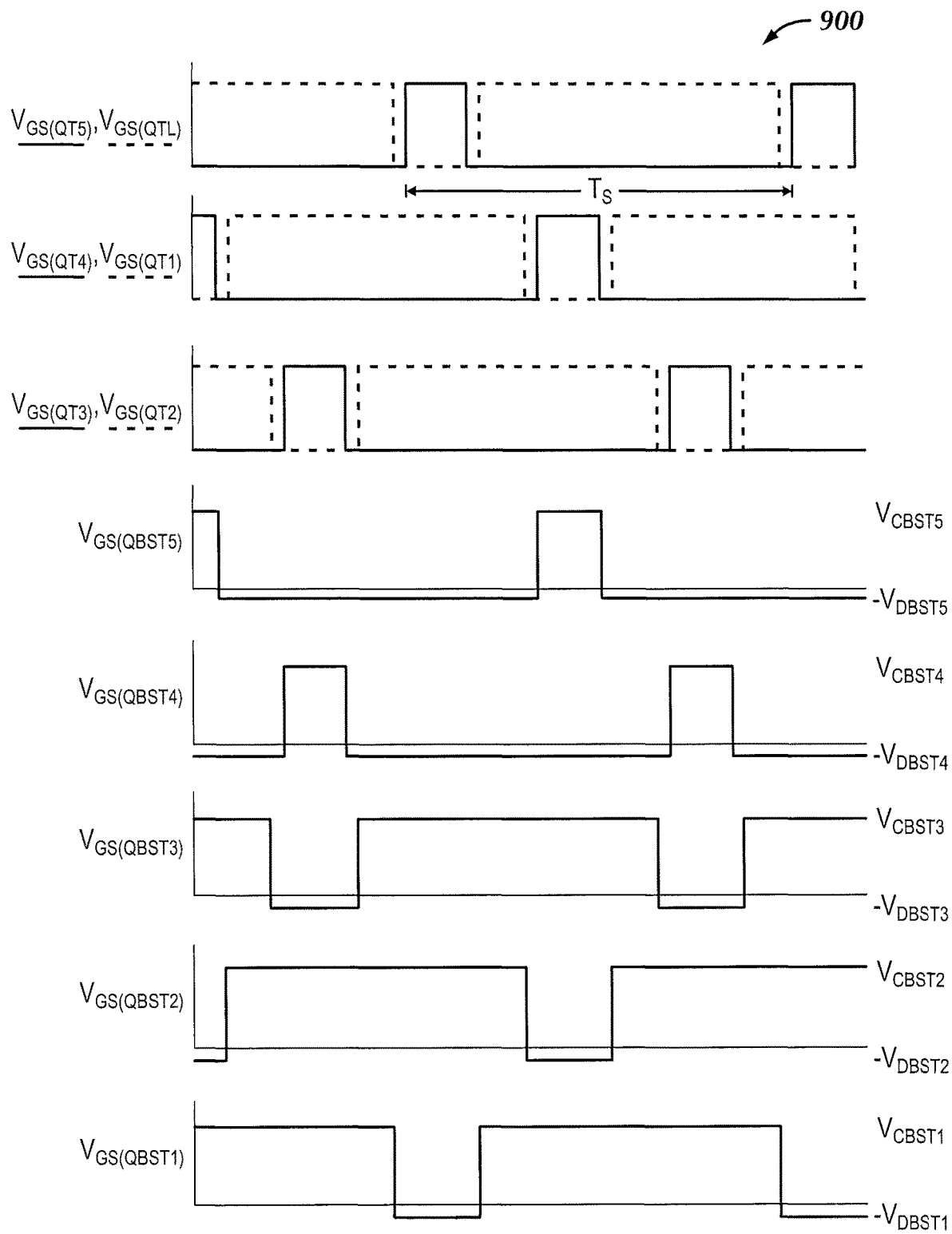
FIG. 9 shows a timing diagram for the four-level flying capacitor circuit of FIG. 8.

FIG. 9 shows a timing diagram 900 for the four-level flying capacitor circuit 800 of FIG. 5. More specifically, the timing diagram 900 shows the $V_{GS}$ for different transistors as a function of time. As shown, the $V_{GS}$ for $Q_{BST1}$ includes an interval in high state and a second interval in a low state, repeating every period $T_s$. Meanwhile, the $V_{GS}$ for $Q_{BST2}$ includes an interval in low state and a second interval in a high state, repeating every period $T_s$. Also, the $V_{GS}$ for $Q_{BST3}$ includes an interval in a high state and a second interval in a low state, repeating every period $T_s$. Also, the $V_{GS}$ for $Q_{BST4}$ includes an interval in low state and a second interval in a high state, repeating every period $T_s$. Also, the $V_{GS}$ for $Q_{BST5}$ includes an interval in high state and a second interval in a low state, repeating every period $T_s$.

In timing diagram 900, the $V_{GS}$ waveforms for $Q_{BST1}$, $Q_{BST2}$, and $Q_{BST3}$ are shifted versions of each other, where the low states do not overlap. Meanwhile, the high states for the $V_{GS}$ of $Q_{BST4}$ occur during low states for the $V_{GS}$ of $Q_{BST3}$, with some offset between transitions for the $V_{GS}$ of $Q_{BST4}$ and transitions for the $V_{GS}$ of $Q_{BST3}$ (i.e., the $V_{GS}$ of $Q_{BST4}$ is nearly an inverted version of the $V_{GS}$ of $Q_{BST3}$ with some offset between their respective transitions). Also, the high states for the $V_{GS}$ of $Q_{BST5}$ occur during low states for the $V_{GS}$ of $Q_{BST2}$, with some offset between transitions for the $V_{GS}$ of $Q_{BST5}$ and transitions for the $V_{GS}$ of $Q_{BST3}$ (i.e., the $V_{GS}$ of $Q_{BST5}$ is nearly an inverted version of the $V_{GS}$ of $Q_{BST2}$, with some offset between their respective transitions).

Meanwhile, the $V_{GS}$ for $Q_{T3}$ matches the $V_{GS}$ for $Q_{BST4}$, and the $V_{GS}$ for $Q_{T2}$ matches the $V_{GS}$ for $Q_{BST3}$. Also, the $V_{GS}$ for $Q_{T4}$ matches the $V_{GS}$ for $Q_{BST5}$, and the $V_{GS}$ for $Q_{T1}$ matches the $V_{GS}$ for $Q_{BST2}$. Also, the $V_{GS}$ for $Q_{TL}$ matches the $V_{GS}$ for $Q_{BST1}$. As shown, the high states for the $V_{GS}$ of $Q_{T5}$ occur during low states for the $V_{GS}$ of $Q_{BST1}$ with some offset between transitions for the $V_{GS}$ of $Q_{T5}$ and transitions for the $V_{GS}$ of $Q_{BST1}$ (i.e., the $V_{GS}$ of $Q_{T5}$ is nearly an inverted version of the $V_{GS}$ of $Q_{BST1}$ with some offset between their respective transitions).

Figure 10:
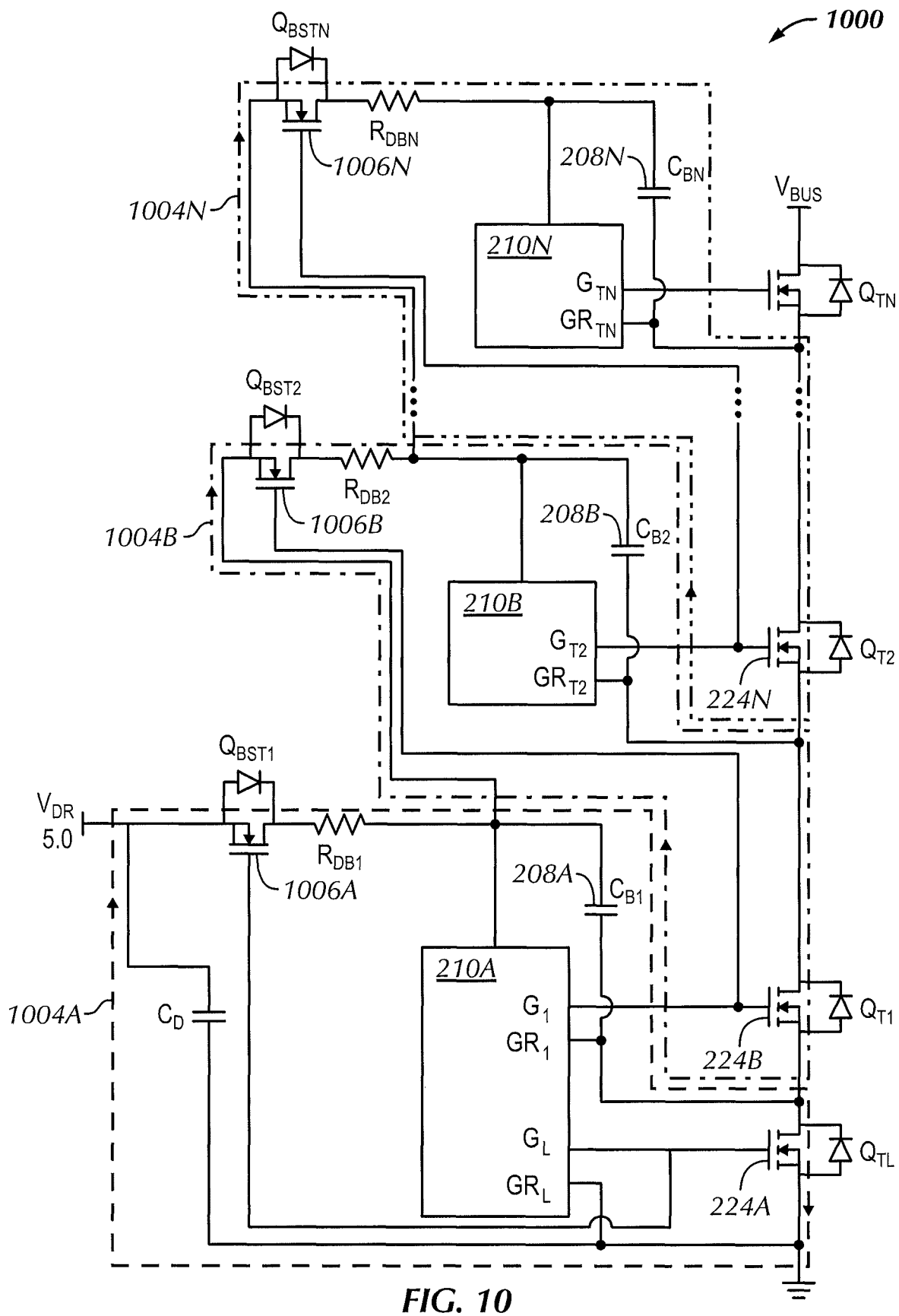
FIGS. 10-13 shows gate driver circuits in accordance with various embodiments of the present invention.

FIGS. 10-13 shows other cascaded bootstrap supply circuits 1000, 1100, 1200, 1300 in accordance with various additional embodiments of the present invention. In FIG. 10, the circuit 1000 includes a plurality of drive control loops 1004A-1004N with respective GaN transistors 1006A-1006N, where the GaN transistors 1006A-1006N are depletion mode transistors. With depletion mode transistors $Q_{BST1}$-$Q_{BSTN}$, various components (e.g., $C_{BST1}$-$C_{BSTN}$ and $D_{BST1}$-$D_{BSTN}$) are not needed as compared to the circuit 300 of FIG. 3.

Figure 11:
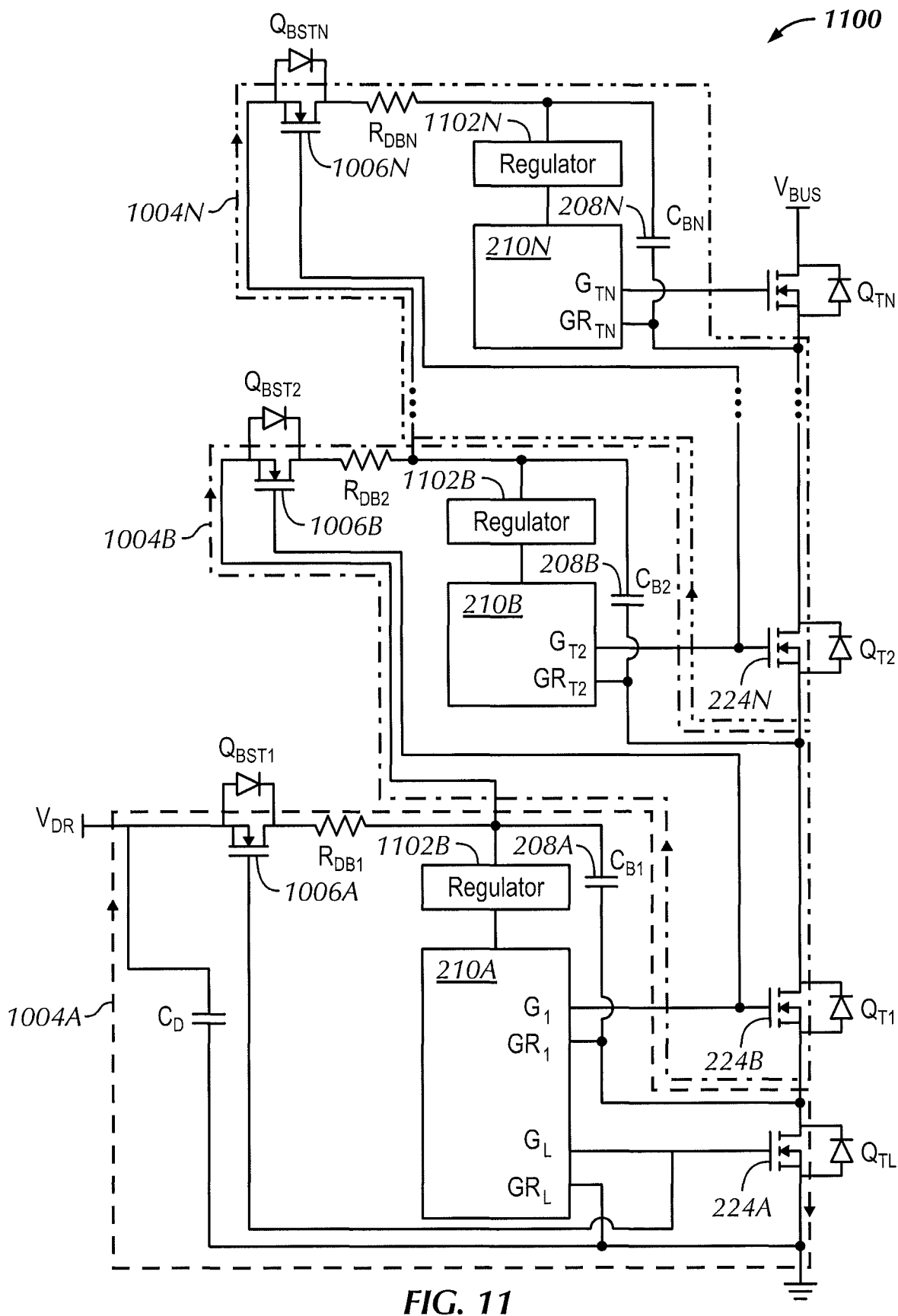

In FIG. 11, circuit 1100 includes the plurality of drive control loops 1004A-1004N with respective GaN transistors 1006A-1006N corresponding to depletion mode transistors, where each of the drive control loops 1004A-1004N couples to a respective voltage regulator 1102A-1102N. Voltage regulators 1102A-1002N may be linear dropout (LDO) regulators, or switched-mode power supplies. In operation, the voltage regulators 1102A-1102N reduce the voltage variation of the different drive control loops 1004A-1004N. Because the voltage variation for the drive control loops 1004A-1004N is smaller compared to loops of the prior art circuit of FIG. 1, the components and operations of circuit 1100 are simplified and lower circuit losses are achieved as compared to the prior art circuit of FIG. 1. Voltage regulators 1102A-1102N may be integrated with a respective one of the drive stages 210A-210N, or provided as discrete components. This embodiment is also possible using normally off enhancement mode GaN transistors with the addition of the bootstrap diodes ($D_{BST1}$-$D_{BSTN}$) and the second bootstrap capacitors ($C_{BST1}$-$C_{BSTN}$).

Figure 12:
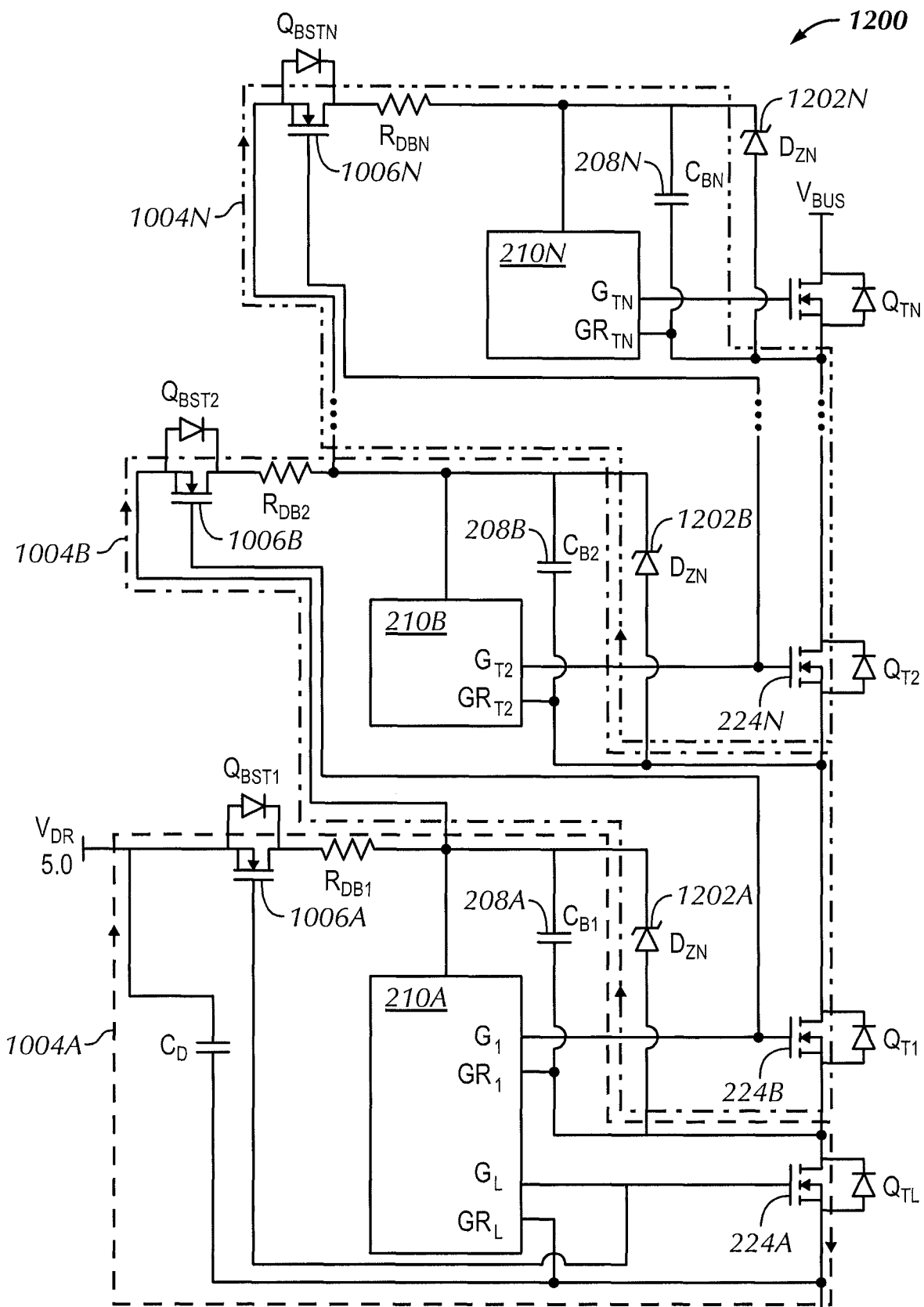

In FIG. 12, the circuit 1200 include the plurality of drive control loops 1004A-1004N with respective depletion mode GaN transistors 1006A-1006N, where each of the drive control loops 1004A-1004N includes a Zener diode 1202A-1202N (labeled $D_{Z1}$-$D_{ZN}$) in parallel with a respective one of the bootstrap capacitors 208A-208N ($C_{B1}$-$C_{BN}$). In operation, Zener diodes $D_{Z1}$-$D_{ZN}$ reduce voltage variation of the different drive control loops 1004A-1004N. Zener diodes $D_{Z1}$-$D_{ZN}$ may be integrated with the drive stages 210A-210N or provided as discrete components. With the significantly reduced bootstrap capacitor voltage variation compared to the prior art circuit of FIG. 1, the lower overhead voltage regulation will significantly reduce Zener clamp requirements and circuit losses. This embodiment is also possible using normally off enhancement mode GaN transistors with the addition of the bootstrap diodes ($D_{BST1}$-$D_{BSTN}$) and the second bootstrap capacitors ($C_{BST1}$-$C_{BSTN}$).

Figure 13:
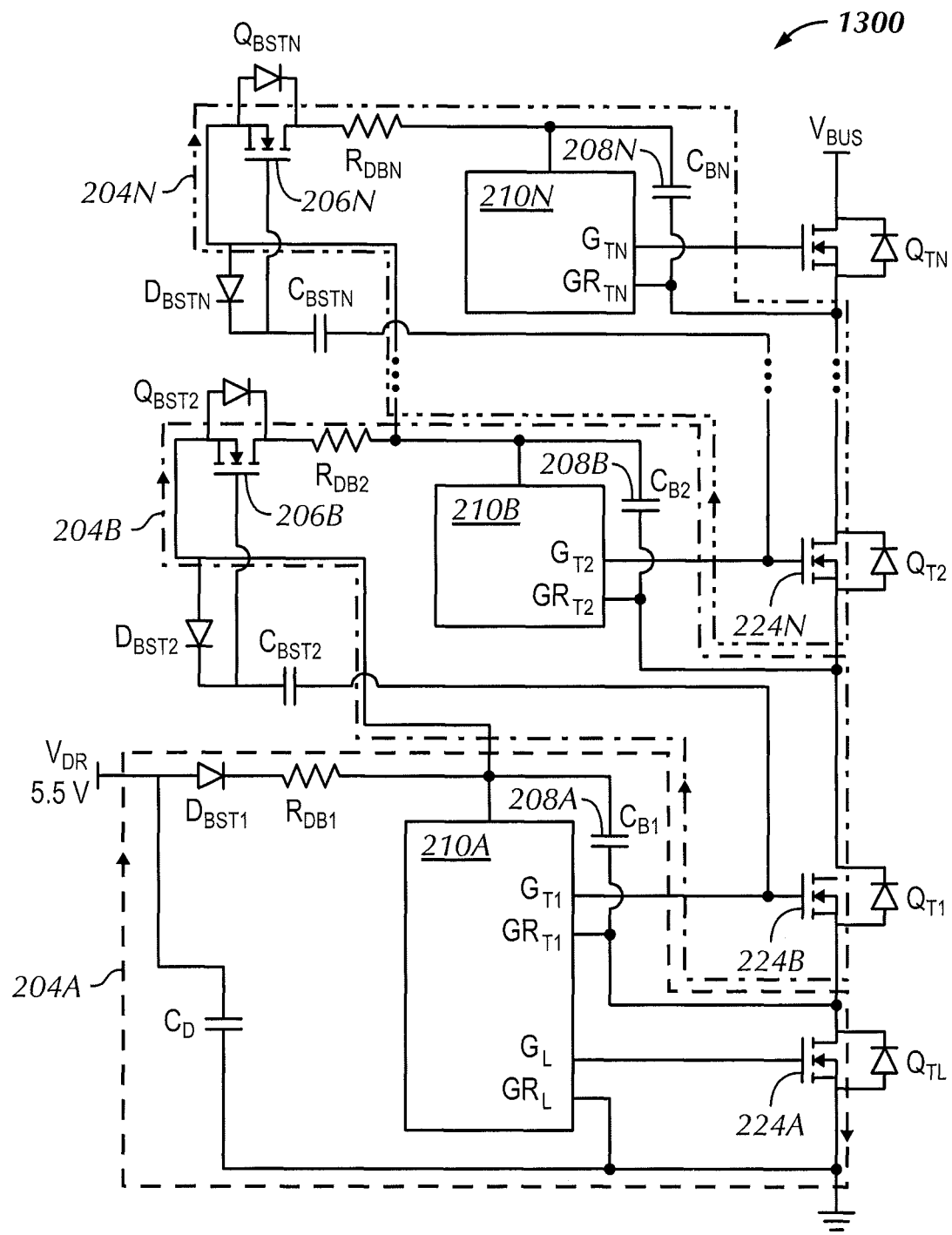

In FIG. 13, the circuit 1300 includes a plurality of drive control loops including base drive control loop 1302 and upper drive control loops 204B-204N. As shown in FIG. 13, the base drive control loop 1302 employs a bootstrap diode (labeled $D_{B1}$) instead of a GaN transistor. In circuit 1300, the lowest level requiring a bootstrap (in this example $C_{B1}$ for $Q_{T1}$) is charged conventionally through $D_{B1}$ when conduction directly to ground is possible. When a ground path is not possible or practical, the cascaded synchronous bootstrap is employed ($C_{B2}$ to $C_{BN}$ in this example), creating a partial/hybrid cascaded synchronous bootstrap arrangement where part of the bootstrapping is done conventionally and part is done through cascaded synchronous bootstrapping.

In some partial/hybrid cascaded synchronous bootstrap embodiments, the enhancement mode GaN transistors ($Q_{BST2}$-$Q_{BSTN}$) of FIG. 13 are replaced with depletion mode GaN transistors. With depletion mode GaN transistors, the bootstrap diodes ($D_{BST1}$-$D_{BSTN}$) and the second bootstrap capacitors ($C_{BST1}$-$C_{BSTN}$) used to create positive gate voltage signals in circuit 1300 are not needed.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A cascaded synchronous bootstrap gate driver circuit for driving a plurality of power transistors of a multi-level converter, comprising:
   a plurality of cascaded drive control loops, each loop including a gallium nitride (GaN) transistor having a gate terminal connected to a gate terminal of one of the plurality of power transistors, a bootstrap capacitor charged by a current passing through the GaN transistor, and a drive stage connected to the bootstrap capacitor and configured to selectively couple and decouple an adjacent drive control loop, wherein each drive control loop is configured to selectively drive a respective one of the plurality of power transistors of the multi-level converter.

2. The cascaded synchronous bootstrap gate driver circuit of claim 1, wherein each drive control loop further comprises a resistor connected in series with, and disposed between, the GaN transistor and the bootstrap capacitor.

3. The cascaded synchronous bootstrap gate driver circuit of claim 1, wherein each bootstrap capacitor is connected in series with a current terminal of a respective GaN transistor.

4. The cascaded synchronous bootstrap gate driver circuit of claim 1, wherein each GaN transistor is a depletion mode transistor.

5. The cascaded synchronous bootstrap gate driver circuit of claim 1, wherein each GaN transistor is an enhancement mode transistor.

6. The cascaded synchronous bootstrap gate driver circuit of claim 5, wherein each bootstrap capacitor comprises a first bootstrap capacitor, and each drive control loop further comprises a second bootstrap capacitor, wherein each first bootstrap capacitor is connected in series with a current terminal of a respective GaN transistor, and wherein each second bootstrap capacitor is connected to a gate terminal of the respective GaN transistor.

7. The cascaded synchronous bootstrap gate driver circuit of claim 1, wherein at least one of the drive control loops further comprises a voltage regulator connected to the bootstrap capacitor to regulate the voltage on the capacitor.

8. The cascaded synchronous bootstrap gate driver circuit of claim 7, wherein the voltage regulator comprises a linear dropout (LDO) regulator.

9. The cascaded synchronous bootstrap gate driver circuit of claim 7, wherein the voltage regulator comprises a switched-mode power supply.

10. The cascaded synchronous bootstrap gate driver circuit of claim 1, wherein each drive control loop further comprises a Zener diode in parallel with a respective bootstrap capacitor.

11. The cascaded synchronous bootstrap gate driver circuit of claim 1, further comprising a base drive control loop that is a ground referenced loop, and wherein each of the other drive control loops is a non-ground referenced loop.

12. The cascaded synchronous bootstrap gate driver circuit of claim 11, wherein the base drive control loop comprises a bootstrap capacitor connected in series with a diode and a resistor, and a drive stage connected to the bootstrap capacitor and configured to selectively couple and decouple an adjacent drive control loop.

13. The cascaded synchronous bootstrap gate driver circuit of claim 1, wherein each drive control loop is configured to drive a separate power transistor in a sequence.

14. The cascaded synchronous bootstrap gate driver circuit of claim 1, wherein each drive stage comprises a controller, level shift logic, and complementary switches.

15. The cascaded synchronous bootstrap gate driver circuit of claim 1, wherein the circuit is formed of discrete components.

16. The cascaded synchronous bootstrap gate driver circuit of claim 1, wherein the circuit is formed of integrated circuit components.

17. The cascaded synchronous bootstrap gate driver circuit of claim 16, wherein the circuit is a single integrated circuit.

18. The cascaded synchronous bootstrap gate driver circuit of claim 16, wherein the circuit is formed of multiple integrated circuits that are coupled together.

19. The cascaded synchronous bootstrap gate driver circuit of claim 1, further comprising a controller to balance voltage levels for flying capacitors connected in parallel with the power transistor of the multi-level converter.

* * * * *